(12) United States Patent
C et al.

(10) Patent No.: US 12,651,687 B2
(45) Date of Patent: Jun. 9, 2026

---

(54) ZERO NOISE MAGNETIC FIELD SYSTEM

(71) Applicant: ZEALOGICS TECHNOLOGIES PVT. LTD., Kochi (IN)

(72) Inventors: Lal K. C, Kochi (IN); Gursaran Singh Bhumbra, Leicester (GB)

(73) Assignee: ZEALOGICS TECHNOLOGIES PVT. LTD., Kochi (IN)

( * ) Notice: Subject to any disclaimer, the term of this patent is extended or adjusted under 35 U.S.C. 154(b) by 198 days.

(21) Appl. No.: 18/431,428

(22) Filed: Feb. 2, 2024

(65) Prior Publication Data

US 2024/0266098 A1     Aug. 8, 2024

(30) Foreign Application Priority Data

Feb. 3, 2023     (IN) .............................. 202341007032

(51) Int. Cl.
| | |
|---|---|
| *H01H 47/00* | (2006.01) |
| *H01F 6/00* | (2006.01) |
| *H01F 6/04* | (2006.01) |
| *H01F 6/06* | (2006.01) |
| *H10N 60/82* | (2023.01) |

(52) U.S. Cl.
CPC ............. *H01F 6/065* (2013.01); *H01F 6/008* (2013.01); *H01F 6/04* (2013.01); *H10N 60/82* (2023.02)

(58) Field of Classification Search
None
See application file for complete search history.

(56) References Cited

U.S. PATENT DOCUMENTS

| | | | | | |
|---|---|---|---|---|---|
| 5,017,549 | A | * | 5/1991 | Robertson ................. | F41B 6/00 |
| | | | | | 89/8 |
| 5,757,257 | A | * | 5/1998 | Doi ........................ | H01F 6/008 |
| | | | | | 324/318 |
| 6,828,919 | B1 | * | 12/2004 | Gold ...................... | H02P 9/302 |
| | | | | | 318/718 |
| 2016/0351310 | A1 | * | 12/2016 | Rey ....................... | H10N 60/01 |
| 2017/0261574 | A1 | | 9/2017 | Stainsby et al. | |
| 2019/0362874 | A1 | * | 11/2019 | Amano ..................... | H01F 6/06 |

FOREIGN PATENT DOCUMENTS

JP     H10188754 A     7/1998

* cited by examiner

*Primary Examiner* — Stephen W Jackson
(74) *Attorney, Agent, or Firm* — Seed Intellectual Property Law Group LLP

(57)     ABSTRACT

The present invention is a system that produces zero noise magnetic field, which consists of: a coil made of superconducting wire, a precision current source, a Normally Closed Reed (NC) Relay, a Normally Opened (NO) Reed Relay, a cooling mechanism to maintain the superconductor temperature below the critical temperature. The precision current source generates the necessary initial current to act as source for the superconducting coil. The NO reed relay connects the precision current source to the superconductive coil. When this current start to flow, the NC Relay is used to close a superconductive path of the superconductive coil on to itself. Once the system becomes stabilized, the NO reed relay is made open, cutting off the precision source while the Normally Closed relay is closed, thereby a steady value current keeps flowing inside the superconducting coil with zero resistance and zero magnetic noise.

12 Claims, 1 Drawing Sheet

ZERO NOISE MAGNETIC FIELD SYSTEM

FIELD OF INVENTION

The present invention relates to the field of magnetic fields. More specifically it relates to the field of supercon-ductors and the use of reed relays to create a zero-noise magnetic field using zero noise current, the reduction of Noise in Magnetic Field of Ultra-Low noise coils, especially in Scanning Electron Micrograph.

BACKGROUND OF THE INVENTION

A magnetic field is produced around magnetic substances, electric current or a flowing electric field. Using a magnetic field, electric current can be produced, electromagnets, etc. can be formed. This is the principle behind most modern technological gadgets in use today, from the humble refrig-erators to computer disks to phones and scientific and medical instruments and techniques like the MRI, advanced Scanning Electron Micrograph etc.

For many scientific researches, techniques and working of electromagnetic devices, a very low or zero noise magnetic field is essential. The noise is produced due to the atoms in the materials vibrating acted upon by electromagnetic forces. This noise interferes in signal measurements, elec-trical current, imaging, causing decoherence in high-resolu-tion transmission electron microscopy (TEM), etc. Hence a low or zero noise magnetic field is highly desirable.

Superconductors are materials that obtain near perfect electrical conductivity at extremely low temperatures and possess no electrical resistance and electric current can keep flowing without loss typically due to resistance. Supercon-ductors expel the magnetic field from the interior by the passage of electric current at the surface, so the magnetic field created by this flow of current cancels the external magnetic field. The net magnetic field inside the supercon-ductor is zero. Superconductors are essential for the making of MRIs, particle accelerators, cell phone towers, etc. Super-conducting electronics is one developing field, which pro-vides different applications like Squid magnetometers, Cur-rent limiters, electronic filters, etc.

A relay is an electrically operated switch. It can have any number of contacts and make or break contacts in any combination depending on the arrangement, whether it is an independent low power signal or a single signal controlling one or multiple circuits. Relays can be manufactured using semiconductors, electromagnets, etc. Superconductor relays are constructed from superconducting materials wherein the relay is not affected by magnetic fields and has zero resis-tance when on and infinite resistance when off.

A filter is an electronic circuit that selectively filters out certain frequencies allowing the desirable frequencies to get through. Problems occur with noises that make it differen-tiate between different frequencies. For telecommunications, highly efficient filters are required to function efficiently.

Let us see some of the papers and patent works related to the fields of superconductors and magnetic fields.

In the paper titled "Ultra-low noise magnetic field for quantum gases", a bias magnetic field is stabilized at 14.5 G, with the RMS value of the noise reduced to 18.5 µG by placing µ-metal magnetic shields together with a dynamical feedback circuit. Long-time instability and noise ratios are significantly suppressed.

In the patent JPH10188754A (Superconducting relay), pair of superconductor leads each having a thin supercon-ductor film 2 are arranged so that at normal operating temperature their thin superconductor films 2 make electric contact with each other, with at least one of the supercon-ductor leads comprising a bimetal lead 4 laminated with the thin superconductor film 2 and a layer 1 which is non-superconducting near the critical temperature of the thin superconductor film 2. Near the critical temperature of the thin superconductor film 2, base layer 1 has a smaller coefficient of thermal expansion than the thin superconduc-tor film 2.

In the patent US2017261574 (Magnetic resonance imag-ing system capable of rapid field ramping), a superconduct-ing switch connects the superconducting magnet and a power supply in a connected circuit in systems like a magnetic resonance imaging system. The supply current is adjusted to increase or decrease the current density in the superconducting magnet to increase or decrease the mag-netic field strength in a controlled manner.

These above patents discuss about superconducting relays and rapid control of fields. Though they employ supercon-ductive coil for magnetic field (a known technology), they do not concern with anything about the noise. Our present invention is a different application that makes zero-noise magnetic fields. The switch is described as a generic concept only in the above two patents, and the superconductive NC and NO read-relays described in our invention is novel concept.

Thus, there exists a need for an invention for producing zero noise magnetic fields. The present invention relates to a magnetic field with Zero Noise, and is based on super-conductive coils and superconductive reed relays. This mag-netic field is produced by a superconductive coil, whose current is superconducting within the coil and is ever-continuing. Since this ever-continuing current has no loss, including in the form of noise, the current and the magnetic field it produces, cannot have any Noise. So, it is a zero-noise magnetic field.

SUMMARY OF THE INVENTION

The following summary is provided to facilitate a clear understanding of the new features in the disclosed embodi-ment and it is not intended to be a full, detailed description. A detailed description of all the aspects of the disclosed invention can be understood by reviewing the full specifi-cation, the drawing and the claims and the abstract, as a whole.

The main objective of our present invention is to provide a system capable of producing magnetic fields with zero noise. In this present invention, a superconducting coil is used as magnetic winding. The coil is energized to the desired current by a precision current source, to get the magnetic flux. And the coil is closed on itself by using a "normally closed" superconducting relay. After this, the external current source is removed. Since the superconduc-tor has no loss, the current continues to run in the coil (a well-known fact). Since the current remains the same, there is no loss due to any reason, including noise.

This aspect is used in our present invention to generate and maintain a zero noise magnetic flux. Also, there are 2 superconductive reed relays as part of the invention 1. Normally closed superconducting reed relay and 2. Nor-mally open superconducting reed relay.

BRIEF DESCRIPTION OF THE DRAWINGS

The manner in which the present invention is formulated is given a more particular description below, briefly summarized above, may be had by reference to the components, some of which is illustrated in the appended drawing It is to be noted; however, that the appended drawing illustrates only typical embodiments of this invention and are therefore should not be considered limiting of its scope, for the system may admit to other equally effective embodiments.

Throughout the drawings, the same drawing reference numerals will be understood to refer to the same elements and features.

Figure 1:
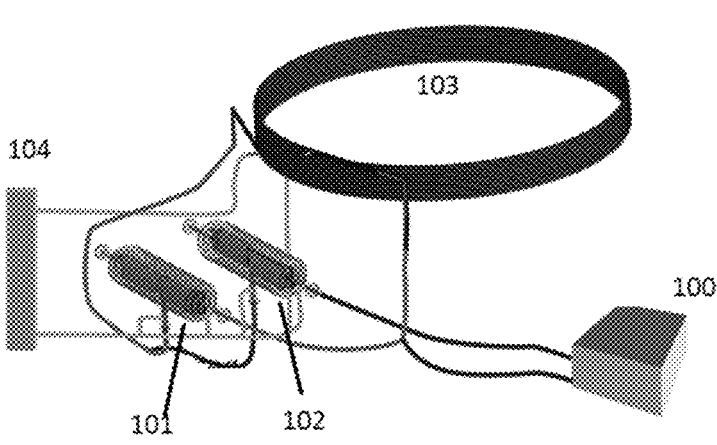
Figure 2:
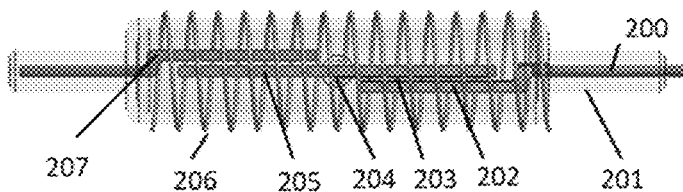
Figure 3:
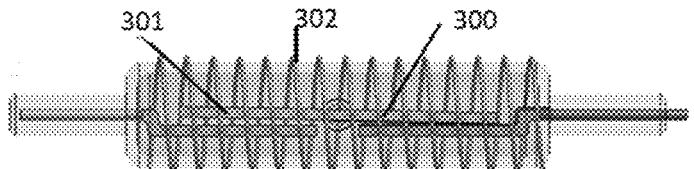

The features and advantages of the present invention will become more apparent from the following detailed description along with the accompanying figures, which form a part of this application and in which:

FIG. 1: Block Diagram describing the components of our system for producing zero-noise magnetic fields in accordance with our present invention;

FIG. 2: Block Diagram describing the Normally Open Relay component of our system for producing zero-noise magnetic fields in accordance with our present invention;

FIG. 3: Block Diagram describing the Normally Closed Relay component of our system for producing zero-noise magnetic fields in accordance with our present invention.

REFERENCE NUMERALS

100—Precision Power Source
101—Normally Closed (NC) relay
102—Normally Open (NO) relay
103—Superconducting coil
104—Cooling system (Liquid Nitrogen)
200—Superconductive NO contact (coolant flowing inside)
201—Glass cover
202—non-magnetic NO Leaf
203—Superconductive lining
204—Superconductive common contact (coolant flowing inside)
205—common leaf of magnetic material
206—magnetic coil
207—Leaf made of magnetic coil
300—Normally contacting common
301—When excited, common leaf turns counter clockwise
302—Magnetic Activation coil

DETAILED DESCRIPTION OF THE INVENTION

The principles of operation, design configurations and evaluation values in these non-limiting examples can be varied and are merely cited to illustrate at least one embodiment of the invention, without limiting the scope thereof.

The embodiments disclosed herein can be expressed in different forms and should not be considered as limited to the listed embodiments in the disclosed invention. The various embodiments outlined in the subsequent sections are constructed such that it provides a complete and thorough understanding of the disclosed invention, by clearly describing the scope of the invention, for those skilled in the art.

Throughout this specification, various indications have been given as to preferred and alternative embodiments of the invention. It should be understood that it is the appended claims, including all equivalents, which are intended to define the spirit and scope of this invention.

The current embodiment of the present invention provides a zero-noise magnetic field/s, a Magnetic field with Zero Noise, and is based on superconductive coils and superconductive reed relays. This Magnetic field is produced by a superconductive coil, whose current is superconducting within the coil and is ever-continuing. Since this ever-continuing current has no loss, including in the form of Noise, the current and the magnetic field it produces, cannot have any Noise. So, it is a Zero-Noise Magnetic field.

The main elements, as shown in FIG. 1, it consists of:
A coil made of superconducting wire (103)
A precision current source (100)
A Normally Closed Reed Relay (101)
A Normally Opened Reed Relay (102)
A cooling mechanism that cools the superconductive elements and keeps it below the Critical temperature (104)

The main components are described below:
1. A superconductive coil (103), made of high temperature superconductive material and is sufficient to produce sufficient field required by the application. The form factor, length, radius etc. of the coil are decided by the application and the parameters of the superconducting cable such as bending radius, tensile strength, critical current, cooling options.
2. A precision current source (100) that can provide the necessary Max value of current and its fractions, with eternal commands from a command terminal or a knob.
3. A Normally Contacting (NC) relay (101) that can close 2 ends of the superconducting coil, without any presence of Magnetic field in that, and open 2 ends of the superconducting coil upon applying a magnetic field, using an Activation coil wound around it.
4. A Normally Open (NO) relay (102) that can connect one end of the Superconducting coil, to one terminal of the Precision current source. Precision current source's other terminal is permanently connected to the other end of the superconducting coil. Thus, closing the Normally Open relay will enable current flow from the current source through the coil.
5. Cooling mechanism (104), in which all the superconducting elements are immersed into a Liquid Nitrogen coolant in one embodiment of our present invention, keeping its temperature below the High temperature Superconductive material's Critical temperature and properly preventing the loss of Liquid Nitrogen (by evaporation or leaking).

The function of the listed elements in the current embodiment of our present invention are given below:

The superconductive coil acts as the winding of an Electromagnet, that produces Zero-noise Magnetic field. Precision current source provides the initial current for the magnetic field. Normally Closed Reed relay is the switchable path by which the superconductive current completes in the coil. Normally Opened Reed Relay is the switchable path to the Precision current source. Since the system operates by the superconductive principle, some of the elements need to be cooled below the Critical Temperature of the superconducting material used.

The components of the Normally Open (NO) relay are described in FIG. 2. It consists of Superconductive NO contact (coolant flowing inside) (200), Glass cover (201), non-magnetic NO Leaf (202), Superconductive lining (203), Superconductive common contact (coolant flowing inside) (204), common leaf of magnetic material (205), magnetic coil (206), Leaf made of magnetic coil (207).

The components of the Normally Closed relay is given in FIG. 3. It consists of: normally contacting common (300), wherein the common when excited turns counter-clockwise (301), and the activation coil (302).

The mechanism in accordance with the current embodiment of our present invention is described in detail as follows:

The Precision current source is now set to the desired current value to produce the required magnetic field. This can be determined by calculations and/or experiments. Once connections are completed, the NC read relay will be connecting the two ends of the superconducting coil each other, superconductively. This loop, will not have any current and it was not imitated and so the magnetic field produced will be zero. Now a current is passed through the activation coil (302) of NC superconducting relay. Due to this, the coil relay gets activated and both ends of the superconducting coil get separated.

The next step is to activate the NO relay by passing a current through the coil around it. This will engage the connection from a terminal of the precision current source to one end of the superconductive coil. The other end of the superconductive coil is already permanently connected to the other terminal of the precision current source. So, this closure of NO relay will cause a current, which is already set in the precision current source to flow through the superconductive coil.

Once this is stabilized from any transient due to switching ON, there will be a steady current in the superconducting coil, and this would produce a steady magnetic field. Though this current will have many noise components due to the semiconductor noise and resistive thermal noise of the driver, and noise produced by the wiring harness to the current source etc.

The next step is to remove current from the NC relay activation coil. This would make the superconductive coil ends to be connected to each other, superconductively. From this time, a superconductive current flow through the superconductive coil, producing a steady and noiseless current flow through the superconductive coil. Since there is no loss of any kind, the current continues to flow in the superconductive circuit, from that moment onwards.

At this point, the NO relay, previously energized will be turned off by removing the current through the activation coil. Now, since the precision current source has no role in the magnetic field, it can be turned off.

This is the operation of Zero noise magnetic field by using superconductive coils and reed relays.

In one embodiment of our present invention, for changing the magnetic field to a new value, the precision current source is set to the new current value.

In another embodiment of our present invention, some parts of the voltage drivers, especially large value resistors can use the superconductor cooling systems to reduce their noise, reducing the cost complexity of the drivers.

In another embodiment of our present invention, this zero-noise magnetic field can be incorporated into other systems requiring less noise like telecommunications, other branches of research and imaging systems.

In another embodiment of our present invention, cooling systems other than liquid nitrogen can be used, depending on the requirement.

In another embodiment of our invention, the number of superconducting coils, and relays can be increased or decreased depending on the required circuit arrangements.

The present invention offers several advantages. Firstly, the system generates zero noise in the magnetic field and can be pre-set to any desired level. It incorporates Superconductive NC read relays and Superconductive NO read relays, allowing for precise adjustments to the current without compromising noise figures. This not only enhances output image quality but also makes the system compatible with advanced Scanning Electron Micrograph systems.

One significant improvement lies in the elimination of dependence on the quality of electronic drivers, which traditionally relies on the noise figures of semiconductors and other components. The current development ensures excellent magnetic field quality independently of the current drive quality, thereby making the driver more cost-effective.

Furthermore, the integration of cooling methods, particularly utilizing Liquid Nitrogen, extends to voltage drivers, reducing voltage noise. This innovation proves economically advantageous, especially for large-value resistors within the voltage drivers.

In addition to these benefits, the noise-free magnetic field opens up diverse applications in imaging and research, expanding the scope and utility of this technological advancement.

The unique features of the current embodiment of our system include: the design of Superconductive read relays, and the method to include them in the superconductive circuit, to set the desired current level and then run the same current without an external current source. This can be used for many applications that require Ultra-Low noise magnetic fields, including Scanning Electron micrographs and other Imaging methodologies, and other industrial applications.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope of the invention as claimed.

We claim:

1. A system for producing zero-noise magnetic field, the system comprising:

a superconducting coil made of superconducting wire;

a precision current source which supplies an initial current;

a normally closed (NC) relay, that is operative to close two ends of the superconducting coil, without any presence of a magnetic field therein, and open two ends of the superconducting coil upon applying a magnetic field, using an activation coil wound around it;

a normally open (NO) relay that is operative to connect one end of the superconducting coil, to one terminal of the precision current source, the precision current source's other terminal being permanently connected to the other end of the superconducting coil such that closing the normally open relay enables current flow from the precision current source through the superconducting coil; and a cooling mechanism that cools the superconductive coil and keeps the superconducting coil below a critical temperature;

wherein the system is configured to function in the following sequence:

the precision current source provides the initial current for the magnetic field, set to a desired current value;

a current is passed through the activation coil of the NC relay, which causes the coil relay to be activated and both ends of the superconducting coil to be separated;

the NO relay is activated by passing a current through the coil around it, which engages the connection from a terminal of the precision current source to one end of the superconductive coil, the other end of the superconductive coil being already permanently connected to the other terminal of the precision current source;

this closure of the NO relay causes a current, which is already set in the precision current source, to flow through the superconductive coil;

once this is stabilized from any transient due to switching ON, a steady current is present in the superconducting coil, which produces a steady magnetic field;

the current is removed from the NC relay activation coil, which makes the ends of the superconductive coil to be connected each other, superconductively, from this time, a superconductive current flows through the superconductive coil, producing a steady and noiseless current flow through the superconductive coil, and since there is no loss of any kind, the current continues to flow in the superconductive circuit, from that moment onwards; and at this point, the NO relay, previously energized is turned off by removing the current through the activation coil, and, since the precision current source has no role in the magnetic field, the precision current source is be turned off.

2. The system for producing zero-noise magnetic field as claimed in claim 1 wherein, the system operates by the superconductive principle, and at least some of the elements need to be cooled below the critical temperature of the superconducting material used.

3. The system for producing zero-noise magnetic field as claimed in claim 1 wherein, the superconductive coil is constructed using high temperature superconductive material and is sufficient to produce an appropriate field required by the application.

4. The system for producing zero-noise magnetic field as claimed in claim 1 wherein, the form factor, length, and radius, of the coil are decided by the application and the parameters of the superconducting cable, including one or more of bending radius, tensile strength, critical current, or cooling options.

5. The system for producing zero-noise magnetic field as claimed in claim 1 wherein, the cooling mechanism, in which all of the superconducting elements are immersed into a liquid nitrogen coolant, keeping its temperature below the high temperature superconductive material's critical temperature and the loss of liquid nitrogen, by evaporation or leaking, is prevented.

6. A system for producing zero-noise magnetic field, the system comprising:

a superconducting coil made of superconducting wire;

a precision current source which supplies an initial current;

a normally closed (NC) relay, that is operative to close two ends of the superconducting coil, without any presence of a magnetic field therein, and open two ends of the superconducting coil upon applying a magnetic field, using an activation coil wound around it;

a normally open (NO) relay that is operative to connect one end of the superconducting coil, to one terminal of the precision current source, the precision current source's other terminal being permanently connected to the other end of the superconducting coil such that closing the normally open relay enables current flow from the precision current source through the superconducting coil; and a cooling mechanism that cools the superconductive coil and keeps the superconducting coil below a critical temperature;

wherein the system operates by the superconductive principle, and at least some of the elements need to be cooled below the critical temperature of the superconducting material used.

7. The system for producing zero-noise magnetic field as claimed in claim 6 wherein, the superconductive coil is constructed using high temperature superconductive material and is sufficient to produce an appropriate field required by the application.

8. The system for producing zero-noise magnetic field as claimed in claim 6 wherein, the form factor, length, and radius, of the coil are decided by the application and the parameters of the superconducting cable, including one or more of bending radius, tensile strength, critical current, or cooling options.

9. The system for producing zero-noise magnetic field as claimed in claim 6 wherein, the cooling mechanism, in which all of the superconducting elements are immersed into a liquid nitrogen coolant, keeping its temperature below the high temperature superconductive material's critical temperature and the loss of liquid nitrogen, by evaporation or leaking, is prevented.

10. A system for producing zero-noise magnetic field, the system comprising:

a superconducting coil made of superconducting wire;

a precision current source which supplies an initial current;

a normally closed (NC) relay, that is operative to close two ends of the superconducting coil, without any presence of a magnetic field therein, and open two ends of the superconducting coil upon applying a magnetic field, using an activation coil wound around it;

a normally open (NO) relay that is operative to connect one end of the superconducting coil, to one terminal of the precision current source, the precision current source's other terminal being permanently connected to the other end of the superconducting coil such that closing the normally open relay enables current flow from the precision current source through the superconducting coil; and a cooling mechanism that cools the superconductive coil and keeps the superconducting coil below a critical temperature;

wherein the superconductive coil is constructed using high temperature superconductive material and is sufficient to produce an appropriate field required by the application.

11. The system for producing zero-noise magnetic field as claimed in claim 10 wherein, the form factor, length, and radius, of the coil are decided by the application and the parameters of the superconducting cable, including one or more of bending radius, tensile strength, critical current, or cooling options.

12. The system for producing zero-noise magnetic field as claimed in claim 10 wherein, the cooling mechanism, in which all of the superconducting elements are immersed into a liquid nitrogen coolant, keeping its temperature below the high temperature superconductive material's critical temperature and the loss of liquid nitrogen, by evaporation or leaking, is prevented.

* * * * *